United States Patent
Hachida et al.

(10) Patent No.: US 9,030,237 B2
(45) Date of Patent: May 12, 2015

(54) TRANSISTOR CIRCUIT, FLIP-FLOP, SIGNAL PROCESSING CIRCUIT, DRIVER CIRCUIT, AND DISPLAY DEVICE

(75) Inventors: Takuya Hachida, Osaka (JP); Yasushi Sasaki, Osaka (JP); Yuhichiroh Murakami, Osaka (JP); Etsuo Yamamoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 13/818,693

(22) PCT Filed: Sep. 1, 2011

(86) PCT No.: PCT/JP2011/069927
§ 371 (c)(1),
(2), (4) Date: Feb. 25, 2013

(87) PCT Pub. No.: WO2012/029915
PCT Pub. Date: Mar. 8, 2012

(65) Prior Publication Data
US 2013/0147524 A1 Jun. 13, 2013

(30) Foreign Application Priority Data

Sep. 2, 2010 (JP) ................................. 2010-197201

(51) Int. Cl.
*H03B 1/00* (2006.01)
*H03K 3/00* (2006.01)
*H03K 17/687* (2006.01)
*G09G 3/36* (2006.01)
*H03K 19/017* (2006.01)
*H01L 27/12* (2006.01)
*H03K 3/356* (2006.01)

(52) U.S. Cl.
CPC ............ *H03K 17/687* (2013.01); *G09G 3/3677* (2013.01); *H03K 19/01714* (2013.01); *H01L 27/124* (2013.01); *H01L 27/1255* (2013.01); *H03K 3/356008* (2013.01); *H03K 3/356026* (2013.01); *G09G 2300/0426* (2013.01); *G09G 2310/0286* (2013.01)

(58) Field of Classification Search
USPC .................................................. 327/108–112
See application file for complete search history.

(56) References Cited

U.S. PATENT DOCUMENTS

| | | | |
|---|---|---|---|
| 5,471,070 | A | 11/1995 | Shimada et al. |
| 2002/0160586 | A1 | 10/2002 | Wada et al. |
| 2007/0091034 | A1 | 4/2007 | Kageyama et al. |
| 2008/0237801 | A1 | 10/2008 | Kisara et al. |
| 2008/0278650 | A1 | 11/2008 | Kajiwara et al. |
| 2010/0072574 | A1 | 3/2010 | Ohshima |
| 2010/0141642 | A1 | 6/2010 | Furuta et al. |
| 2010/0244946 | A1 | 9/2010 | Murakami et al. |
| 2010/0253393 | A1 | 10/2010 | Yamamoto et al. |

FOREIGN PATENT DOCUMENTS

| | | |
|---|---|---|
| JP | 56-115558 A | 9/1981 |
| JP | 06-151848 A | 5/1994 |
| JP | 2002-319606 A | 10/2002 |
| JP | 2007-108305 A | 4/2007 |
| JP | 2008-244098 A | 10/2008 |
| JP | 2008-268261 A | 11/2008 |
| JP | 2010-103508 A | 5/2010 |
| WO | 2009/034750 A1 | 3/2009 |
| WO | 2009/081619 A1 | 7/2009 |
| WO | 2009/084272 A1 | 7/2009 |

OTHER PUBLICATIONS

Official Communication issued in International Patent Application No. PCT/JP2011/069927, mailed on Oct. 4, 2011.

*Primary Examiner* — Diana J Cheng
(74) *Attorney, Agent, or Firm* — Keating and Bennett, LLP

(57) ABSTRACT

A transistor circuit includes at least one transistor, wherein at least part of a connecting portion that connects the transistor (Tr1) and a power supply line (33) is formed from a material of which a channel of the transistor (Tr1) is made. This configuration reduces a circuit area of the transistor circuit.

6 Claims, 15 Drawing Sheets

TRANSISTOR CIRCUIT, FLIP-FLOP, SIGNAL PROCESSING CIRCUIT, DRIVER CIRCUIT, AND DISPLAY DEVICE

TECHNICAL FIELD

The present invention relates to a semiconductor circuit provided, for example, in a driver circuit of a display device.

BACKGROUND ART

Conventionally, in a case where a driving circuit such as a gate driver is constituted by using transistors Tr101 and Tr102 of an identical conductivity type as illustrated in FIG. 15, interconnection between the transistor Tr101 and the transistor Tr102 is made via a source metal (SE) (see FIG. 16(b)). Alternatively, in a case where a power source and/or other element(s) which are placed by using the SE lie between the transistor Tr101 and the transistor Tr102, interconnection between the transistor Tr101 and the transistor Tr102 is made via the SE or a gate metal (GE) (see FIG. 16(a)). Note that in FIGS. 16(a) and 16(b), regions marked with dashed lines indicates a silicon layer, regions marked with solid lines indicate the gate layer which is provided on the silicon layer, and regions filled with a color of gray indicate the metal layer which is provided on the gate layer.

SUMMARY OF INVENTION

Technical Problem

However, the above-described conventional configuration increases the number of contact holes and a layout area due to interconnections, This causes the problem that a circuit area increases on the whole. This results in the difficulty of meeting a recent demand for a narrow picture frame.

An object of the present invention is to reduce a circuit area of a transistor circuit.

Solution to Problem

A transistor circuit according to the present invention includes: at least one transistor, wherein at least part of a connecting portion that connects the transistor and a signal line is formed from a material of which a channel of the transistor is made.

The transistor circuit according to the present invention enables reduction of a circuit area of a transistor circuit.

The transistor circuit according to the present invention includes: a plurality of transistors; and at least one of a connecting portion that connects the transistors and a connecting portion that connect the transistor and a signal line, wherein all of the plurality of transistors included in the transistor circuit are of an identical conductivity type, and the connecting portion is formed from a material of which channels of the respective transistors are made.

The transistor circuit according to the present invention enables reduction of a circuit area of a transistor circuit.

A flip-flop according to the present invention includes: an input terminal; an output terminal; first and second clock signal terminals; a first output section including a bootstrap capacitor and being connected to the first clock signal terminal and the output terminal; a second output section being connected to a first power source and the output terminal; a first input section being connected to the input terminal and a second power source and charging the bootstrap capacitor; a discharge section discharging the bootstrap capacitor; a second input section being connected to the input terminal and the first power source and being connected to the second output section; and a reset section being connected to the second clock signal terminal and controlling the discharge section and the second output section, the foregoing sections including transistors all of which are of an identical conductivity type, and the flip-flop further includes: at least one of a connecting portion that connects the transistor included in the reset section and the second power source and a connecting portion that connects the transistor included in the reset section and the transistor included in the other section, the connecting portion being formed of a material of which channels of the respective transistors are made.

The flip-flop according to the present invention enables reduction of a circuit area.

A signal processing circuit according to the present invention includes: first and second input terminals; an output terminal; a first output section including a bootstrap capacitor and being connected to the second input terminal and the output terminal; a second output section being connected to the first input terminal, a first power source, and the output terminal; a charge section charging the bootstrap capacitor; and a discharge section being connected to the first input terminal and discharging the bootstrap capacitor, the foregoing sections including transistors all of which are of an identical conductivity type, and the signal processing circuit further includes: a connecting portion that connects the transistor included in the first output section and the second power source, the connecting portion being formed of a material of which channels of the respective transistors are made.

The signal processing circuit according to the present invention enables reduction of a circuit area.

A signal processing circuit according to the present invention includes: first through third input terminals; first and second nodes; a first signal generating section being connected to the first node, the third input terminal, and an output terminal and including a bootstrap capacitor; and a second signal generating section being connected to the second node, a first power source, and the output terminal, the first node becoming active when the first input terminal becomes active, the second node becoming active when the second input terminal becomes active, and the signal processing circuit further includes: a connecting portion that connects a transistor included in the first signal generating section and the first power source, the connecting portion being formed of a material of which channels of respective transistors are made.

The signal processing circuit according to the present invention enables reduction of a circuit area.

A driver circuit according to the present invention includes: the above-described transistor circuit; the above-described flip-flop; or the above-described signal processing circuit.

A display device according to the present invention includes: the above-described transistor circuit; the above-described flip-flop; or the above-described signal processing circuit.

Advantageous Effects of Invention

As described above, the present invention enables reduction of a circuit area of a transistor circuit.

DESCRIPTION OF EMBODIMENTS

Embodiment 1

The following will describe an embodiment of the present invention, with reference to the drawings.

Figure 4:
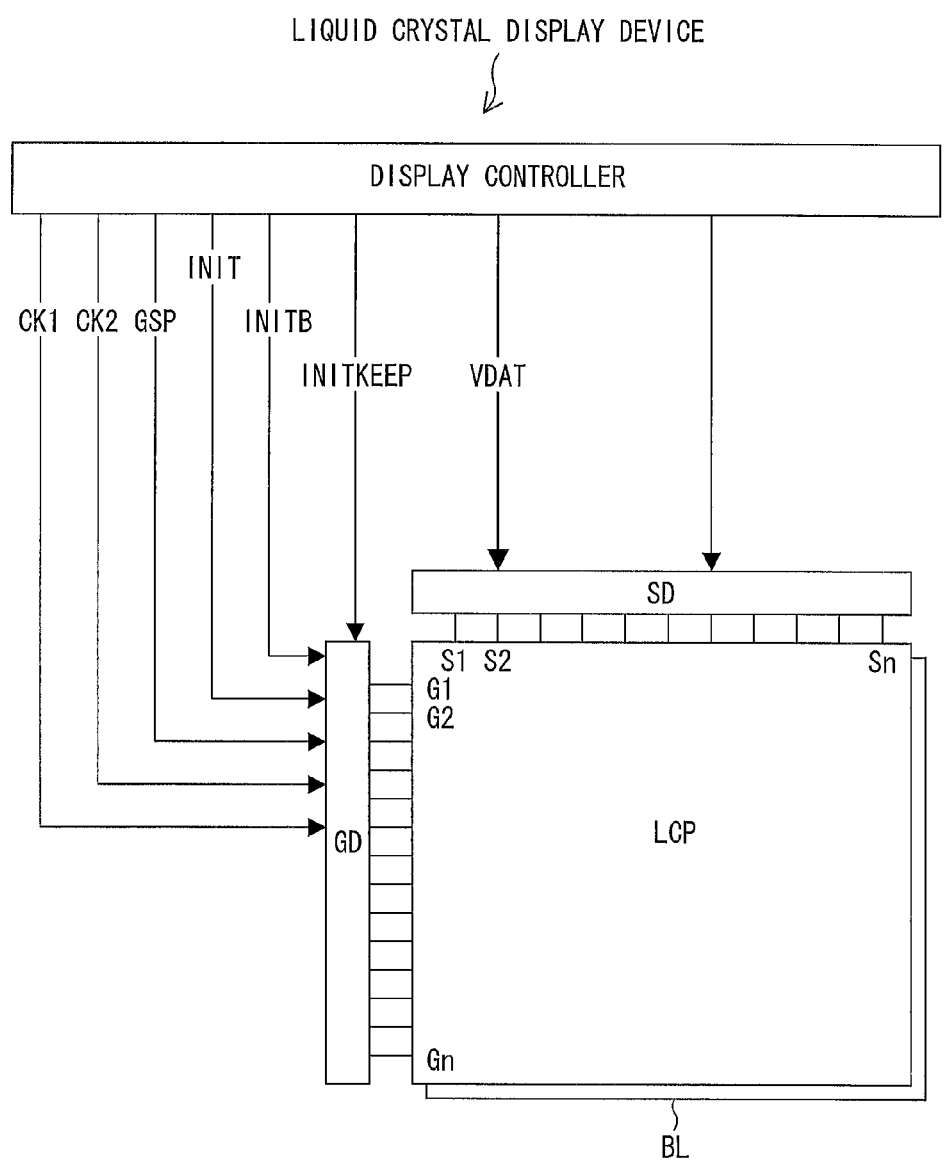
FIG. 4 is a block diagram illustrating an example configuration of a liquid crystal display device including a flip-flop illustrated in FIG. 3.

FIG. 4 illustrates an example configuration of a liquid crystal display device including a flip-flop of the present invention. The liquid crystal display device illustrated in FIG. 4 includes a display controller, a gate driver GD, a source driver SD, a liquid crystal panel LCP, and a backlight BL (which is used in a case where the liquid crystal display device is of a light transmissive type). The display controller controls the gate driver GD and the source driver SD. For example, the display controller supplies, to the gate driver GD, first and second clock signals (CK1 signal and CK2 signal, respectively), a gate start pulse signal (GSP signal), a first initialization signal (INIT signal), a second initialization signal (INITB signal), and a third initialization signal (INITKEEP signal). The gate driver GD drives scanning signal lines G1 to Gn of the liquid crystal panel LCP, while the source driver SD drives data signal lines S1 to Sn of the liquid crystal panel LCP.

Figure 5:
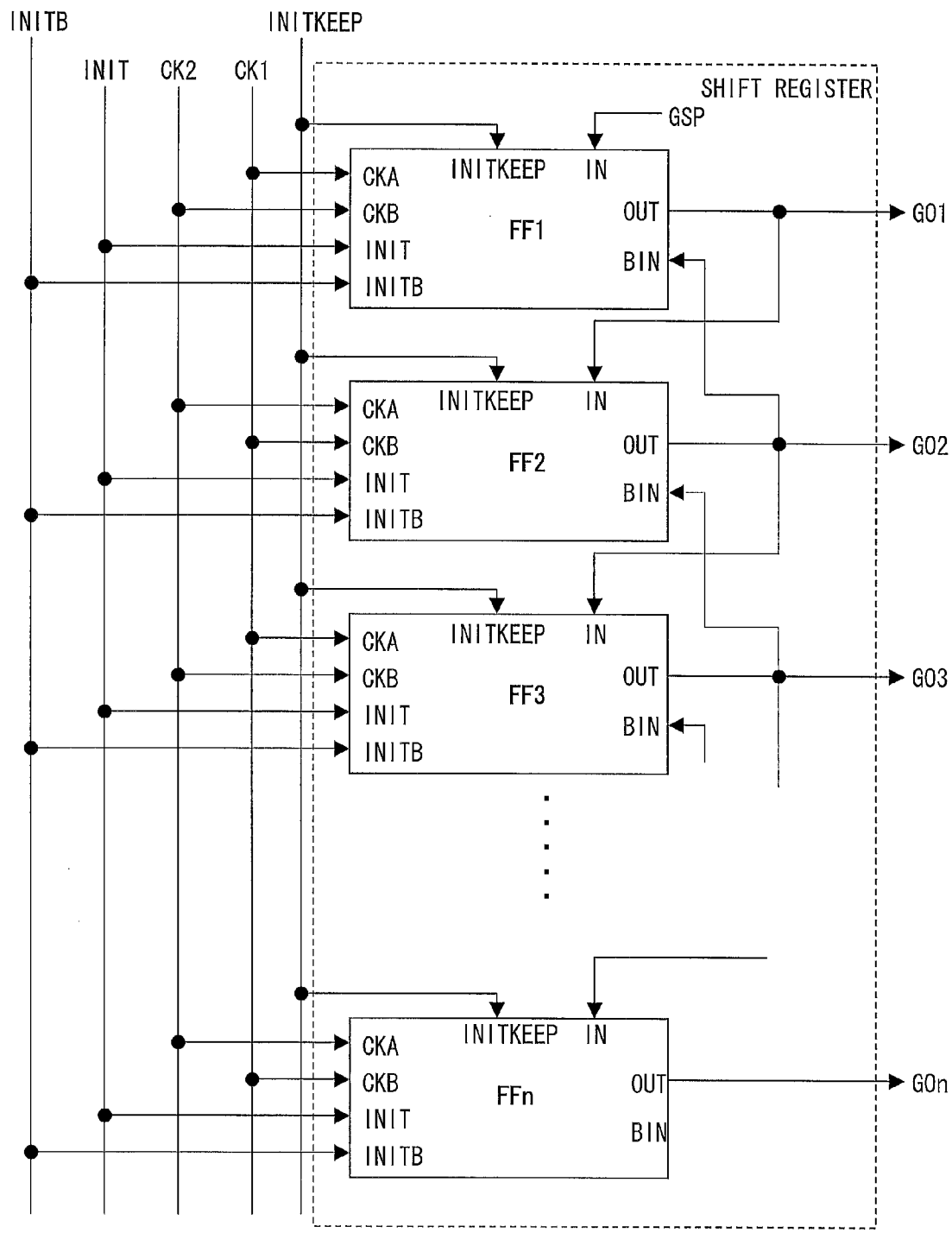
FIG. 5 is a block diagram illustrating an example configuration of a shift register provided in a gate driver for the liquid crystal display device.

The gate driver GD includes a shift register as illustrated in FIG. 5. The shift register illustrated in FIG. 5 includes a plurality of flip-flops that are cascaded with each other. Each of the flip-flops includes an input terminal (IN terminal), an output terminal (OUT terminal), first and second clock signal terminals CKA and CKB, a first initialization terminal (INIT terminal), a second initialization terminal (INITB terminal), a third initialization terminal (INITKEEP terminal), and a back-in terminal (BIN terminal).

Here, in flip-flops in odd-numbered stages (FF1, FF3, etc.), the CK1 signal is supplied to the CKA terminal, and the CK2 signal is supplied to the CKB terminal. In flip-flops in even-numbered stages (FF2, FFn, etc.), the CK2 signal is supplied to the CKA terminal, and the CK1 signal is supplied to the CKB terminal. Further, the INIT signal, the INITB signal, and the INITKEEP signal are supplied to each of the flip-flops (FF1 to FFn). Still further, an IN terminal of one flip-flop stage is connected to an OUT terminal of a preceding flip-flop stage, and a BIN terminal of the one flip-flop stage is connected to an OUT terminal of a subsequent flip-flop stage. Note that the CK1 and CK2 signals are two clock signals arranged such that their active periods (High periods) do not overlap each other.

Figure 3:
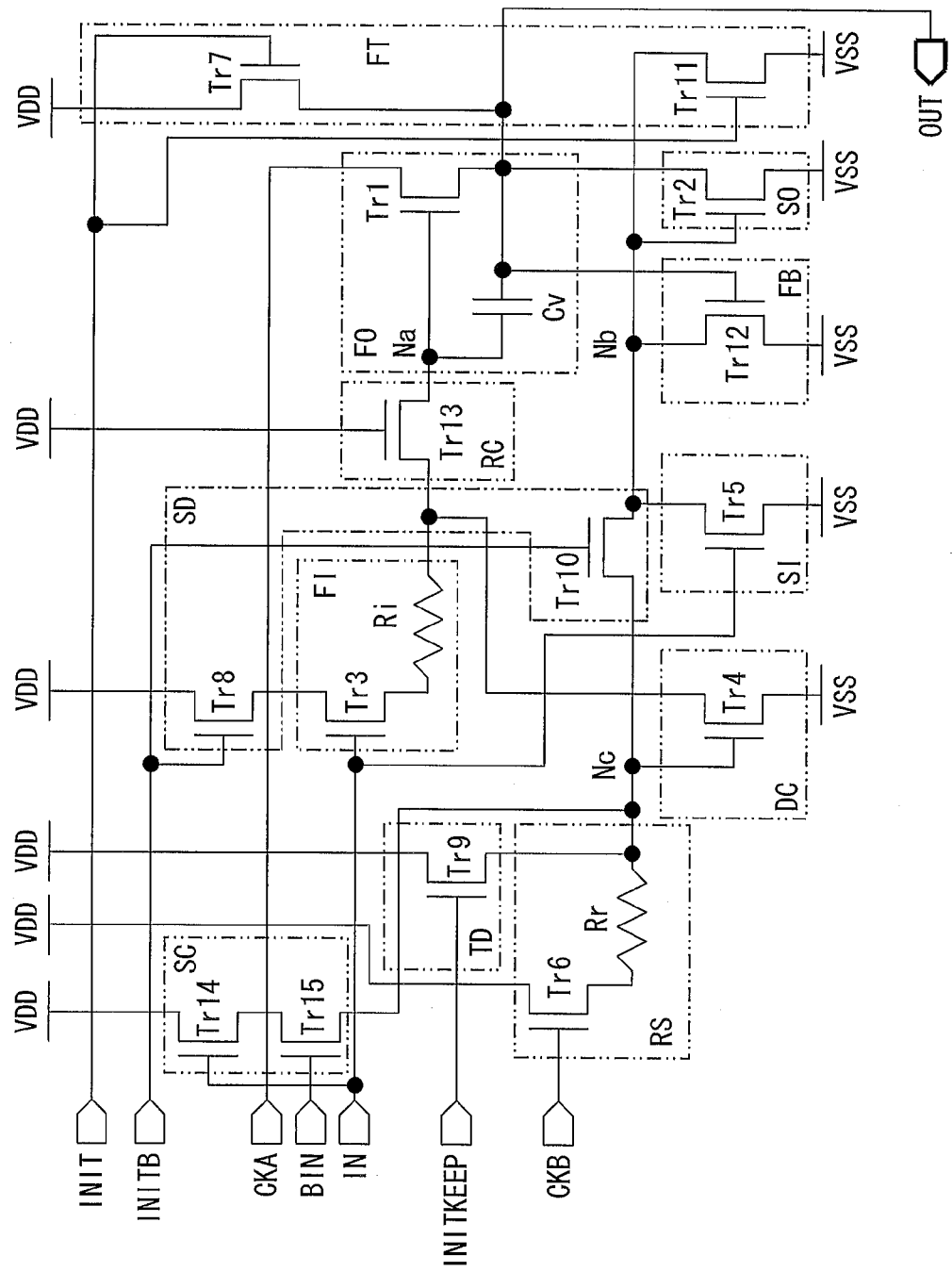
FIG. 3 is a circuit diagram illustrating First Embodiment of a flip-flop according to the present invention.

As each stage of the shift register illustrated in FIG. 5, the flip-flop according to the present invention is used. FIG. 3 illustrates an example configuration of the flip-flop according to the present invention. The flip-flop illustrated in FIG. 3 includes an IN terminal, an OUT terminal, CKA and CKB terminals, and a bootstrap capacitor Cv. This flip-flop illustrated in FIG. 3 is provided with: a first output section FO that is connected to the CKA terminal and the OUT terminal; a second output section SO which is connected to a first power source VSS (low-level power source) and the OUT terminal; a first input section FI which is connected to the IN terminal and a second power source VDD (high-level power source) and charges the bootstrap capacitor Cv; a discharge section DC that discharges the bootstrap capacitor Cv; a second input section SI that is connected to the IN terminal and the first power source VSS and is connected to the second output section; a reset section RS that is connected to the CKB terminal and controls the discharge section DC and the second output section SO; a first initialization section FT that controls the first output section FO; a second initialization section SD that controls the first input section FI; a third initialization section TD that controls the discharge section DC and the second output section SO; a feedback section FB that is connected to the OUT terminal and controls the second output section SO; a relay section RC that relays the first input section FI and the first output section FO; and a malfunction preventing section SC that prevents one flip-flop stage and other flip-flop stage(s) from becoming active at the same time during a regular operation.

More specifically, the flip-flop according to the present invention is configured such that: the first output section FO includes a transistor Tr1 (first transistor) and the bootstrap capacitor Cv; the second output section SO includes a second transistor Tr2 (second transistor); the first input section FI includes a transistor Tr3 (third transistor) and a resistor Ri; the discharge section DC includes a transistor Tr4 (fourth transistor); the second input section SI includes a transistor Tr5 (fifth transistor); the reset section RS includes a transistor Tr6 (sixth transistor) and a resistor Rr; the first initialization section FT includes a transistor Tr7 (seventh transistor) and a transistor Tr11 (eleventh transistor); the second initialization section includes a transistor Tr8 (eighth transistor) and a transistor Tr10 (tenth transistor); the third initialization section includes a transistor Tr9 (ninth transistor); the feedback section FB includes a transistor Tr12 (twelfth transistor); the relay section RC includes a transistor Tr13 (thirteenth transistor); and the malfunction preventing section SC includes transistors Tr14 and Tr15. Note that the transistors Tr1 through Tr15 all are of an identical conductivity-type (n-channel type).

Further, the transistor Tr1 is arranged such that: a drain electrode of the transistor Tr1 is connected to the CKA terminal; a gate electrode and a source electrode of the transistor Tr1 are connected to each other via the bootstrap capacitor Cv; and the source electrode is connected to the OUT terminal and also connected to the first power source VSS via the transistor Tr2.

In addition, respective gate terminals of the transistors Tr3, Tr5, and Tr14 are connected to the IN terminal; a gate terminal of the transistor Tr6 is connected to the CKB terminal; respective gate terminals of the transistors Tr7 and Tr11 are connected to the INIT terminal; gate terminals of the respective transistors Tr8 and Tr10 are connected to the INITB terminal; a gate terminal of the transistor Tr9 is connected to the INITKEEP terminal; a gate terminal of the transistor Tr13 is connected to the second power source VDD; and a gate terminal of the transistor Tr15 is connected to the BIN terminal.

Further, a first node Na connected to the gate terminal of the transistor Tr1 is connected to one end of the resistor Ri via the transistor Tr13 and is connected to the first power source VSS via the transistor Tr4. The other end of the resistor Ri is connected to the second power source VDD via the transistors Tr3 and Tr8 (Note that the transistor Tr3 is located on the side of the resistor Ri, while the transistor Tr8 is located on the side of the second power source VDD.).

Still further, a second node Nb connected to a gate terminal of the transistor Tr2 is connected to the first power source VSS via the transistor Tr5, is connected to the first power source VSS via the transistor Tr11, and is connected to the first power source VSS via the transistor Tr12. In addition, a third node Nc connected to a gate terminal of the transistor Tr4 is connected to the second power source VDD via the transistor Tr9 and is connected to the second power source VDD via the resistor Rr and the transistor Tr6 (Note that the transistor Tr6 is located on the side of the resistor Rr, while the transistor Tr6 is located on the side of the second power source VDD.). The second node Nb and the third node Nc are connected to each other via the transistor Tr10. Moreover, the third node Nc is connected to the second power source VDD via the transistors Tr15 and Tr14 (Note that the transistor Tr15 is located on the side of the third node Nc, while the transistor Tr14 is located on the side of the second power source VDD.).

Figure 6:
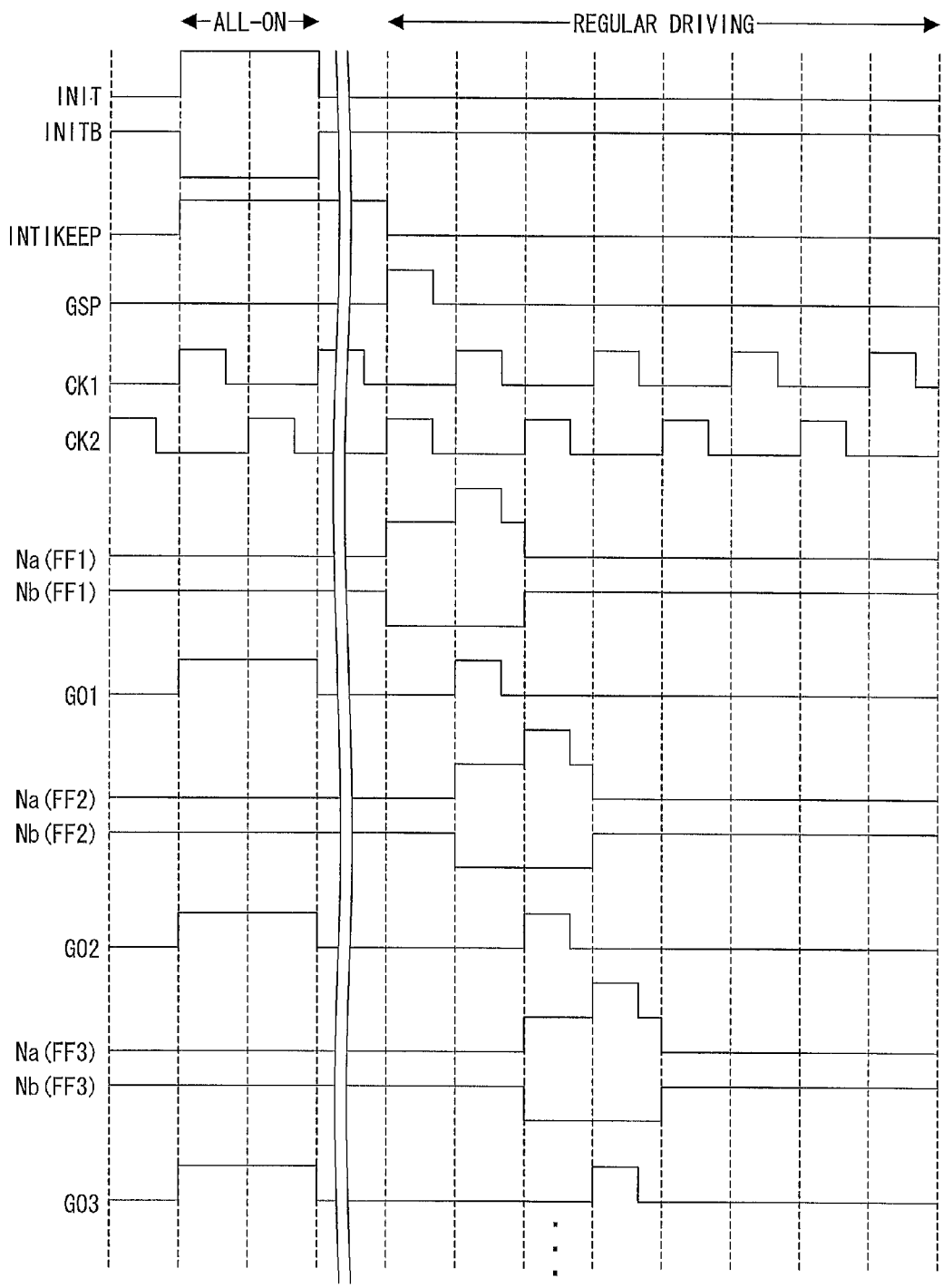
FIG. 6 is a timing chart illustrating waveforms of various signals in the shift register.

The operation of the shift register according to the present invention is illustrated in FIG. 6. During an all-ON period, the INIT signal is active (High), the INITB signal is inactive (Low), and the INITKEEP signal is active (High). The bootstrap capacitor Cv is thus discharged by the discharge section DC (since the transistors Tr9 and Tr4 are switched ON, while the transistor Tr1 is switched OFF.). This causes the first output section FO to become inactive and also causes the second output section SO to become inactive (since the transistor Tr11 is switched ON, while the transistor Tr2 is switched OFF.).

Thus, the source electrode of the transistor Tr1 in the first output section FO is connected to the first power source VSS by the first initialization section FT, so that a VDD potential (High) is reliably outputted to the OUT terminal regardless of the CK1 and CK2 signals. In the present configuration, since the second node and the third node are at a VSS potential and at a VDD potential, respectively, during the all-ON period, the transistor Tr10 is switched OFF by the INITB signal so that both the second node and the third node are interrupted. On the other hand, until the GSP signal becomes active after the completion of the all-ON period, the INIT signal is inactive (Low) and the INITB signal is active (High), the INITKEEP signal is active (High), the transistor Tr10 is switched ON. Consequently, the second output section SO becomes active (the transistor Tr2 is switched ON.). Accordingly, a VSS potential (Low) is reliably outputted to the OUT terminal regardless of the CK1 and CK2 signals.

The operation during a regular driving is as follows. During the regular driving, the INIT signal is inactive (Low), the INITB signal is active (High), and the INITKEEP signal is inactive (Low). Note that the INITKEEP signal becomes inactive (Low) in synchronization with the activation of the GSP signal (the transistors Tr8 and Tr10 are switched ON, while the transistors Tr7 and Tr9 are switched OFF.).

For example, in the flip-flop FF1 at the first stage (see FIG. 5), when the IN terminal becomes active (the GSP signal becomes active), the bootstrap capacitor Cv is charged so that a potential of the first node Na is pre-charged to about a level obtained by the VDD potential–Vth (Vth represents a threshold voltage of a transistor). At this time, since the CK2 signal is High (the CKB terminal is active), the transistor Tr5 and the transistor Tr6 are both switched ON, and the second node Nb becomes a VSS potential. This is because driving performance of the transistor Tr6 becomes higher than that of the transistor Tr5 due to a current limit of the resistor Rr. The VSS potential of the second node Nb is maintained even when the GSP signal becomes inactive (since the transistors Tr2, Tr12, and Tr4 stay OFF).

Here, when the CK1 signal rises, a potential of the first node Na is boosted to a level equal to or greater than the VDD potential due to a bootstrap effect. This causes the CK1 signal (High) to be outputted from the OUT terminal (GO1), without suffering from a potential drop (so-called threshold drop). When the OUT terminal becomes High, the transistor Tr12 of the feedback section FB is switched ON, and the second node Nb reliably becomes the VSS potential. Note that when the CK1 signal falls, the bootstrap effect wears off, and the potential of the first node Na therefore returns to the level obtained by the VDD potential–Vth. Subsequently, when the CK2 signal rises, the transistor Tr4 of the discharge section DC is switched ON. This causes the bootstrap capacitor Cv to be discharged and causes the transistor Tr2 to be switched ON. Consequently, the VSS (Low) is outputted from the OUT terminal (GO1). This completes a reset (self-reset) of the flip-flop FF1.

Further, in the configuration illustrated in FIG. 3, the malfunction preventing section SC is provided. Therefore, in a case where outputs of the preceding flip-flop stage (flip-flop stage previous to the one flip-flop stage) and the subsequent flip-flop stage (flip-flop stage subsequent to the one flip-flop stage) become active during the regular operation, the transistors Tr14 and Tr15 are both switched ON, and the transistor Tr2 is switched ON, so that the OUT terminal can be forcibly set to the VSS potential (Low). Still further, in the configuration illustrated in FIG. 3, the relay circuit RC (Tr13) is provided. Therefore, when the potential of the first node Na reaches a level equal to or higher than a given level due to the bootstrap effect, the transistor Tr13 is switched OFF. This makes it possible to protect the transistor Tr4 of the discharge section DC from a high voltage.

Figure 7:
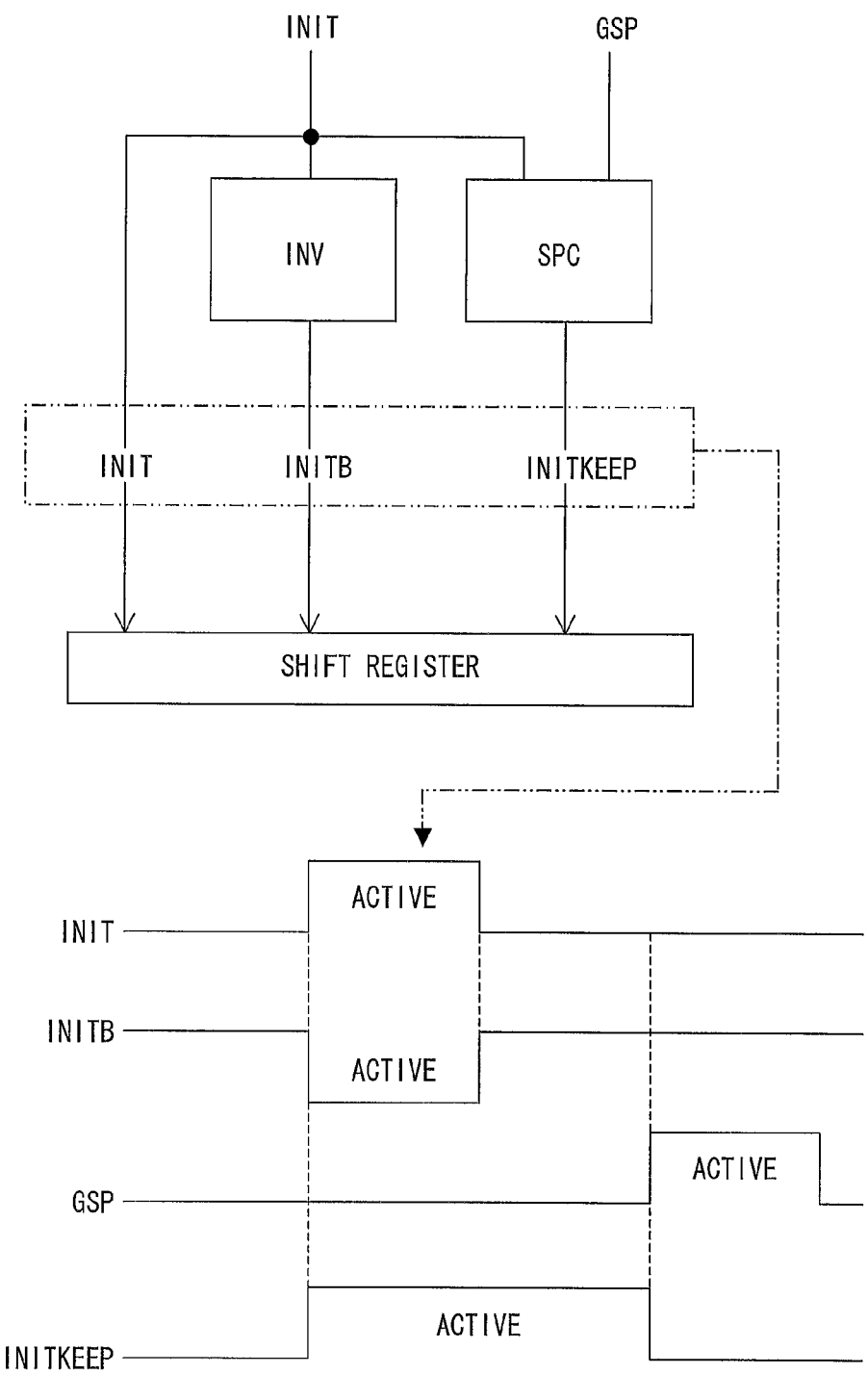
FIG. 7 is a diagram illustrating a method of generating an INIT signal, an INITB signal, and an INITKEEP signal which are supplied to the shift register.

The INITB signal, which is an inversion signal of the INIT signal, and the INITKEEP signal are generated from the INIT signal. That is, as illustrated in FIG. 7, an inverter circuit INV outputs the INTB signal from the INIT signal, and a signal processing circuit SPC generates the INITKEEP signal by using the INIT signal. Here, the INITB signal is an inversion signal of the INIT signal, and the INITKEEP signal becomes active (High) at a timing of transition of the INIT signal from active (High) to inactive (Low). After such a timing, the INITKEEP signal becomes inactive (Low) (for example, in synchronization with the activation of the GSP signal as illustrated in FIG. 6).

(Layout Pattern)

Next, a layout pattern of the flip-flop FF illustrated in FIG. 3 will be described.

The flip-flop FF illustrated in FIG. 3 is practically realized by being formed on a substrate, and the flip-flop FF illustrated in FIG. 3 is arranged, from the substrate side, in the following order of: a channel layer (silicon layer) having channels of the respective transistors formed therein; a gate layer having respective gate electrodes of the transistors formed therein; and a metal layer having signal lines and power supply lines formed therein. Further, a gate insulating layer is formed between the silicon layer and the gate layer, and an interlayer insulating film is formed between the gate layer and the metal layer. These components can be formed, for example, by a conventional and general method of monolithically incorporating a semiconductor circuit into a substrate.

In addition, on the substrate having the flip-flop FF formed thereon, are formed the input terminal (IN terminal), the output terminal (OUT terminal), the first and second clock signal terminals CKA and CKB, the first initialization terminal (INIT terminal), the second initialization terminal (INITB terminal), the third initialization terminal (INITKEEP terminal), a signal line serving as the back-in terminal (BIN terminal), a power supply line through which a first power VSS is supplied, and a power supply line through which a second power VDD is supplied. Note that additional line(s) other than these lines may be formed on the substrate.

The signal lines, the power supply lines, the transistors, the resistors, and the capacitors are laid out on the substrate and are connected to one another so as to realize electrical connections illustrated in FIG. 3. The following will show examples of a layout pattern of an area surrounding a region where the resistor Rr is formed and a layout pattern of an area surrounding a region where the resistor Ri is formed, so as to explain a configuration of connections between the transistors, which configuration is a remarkable point.

Figure 1:
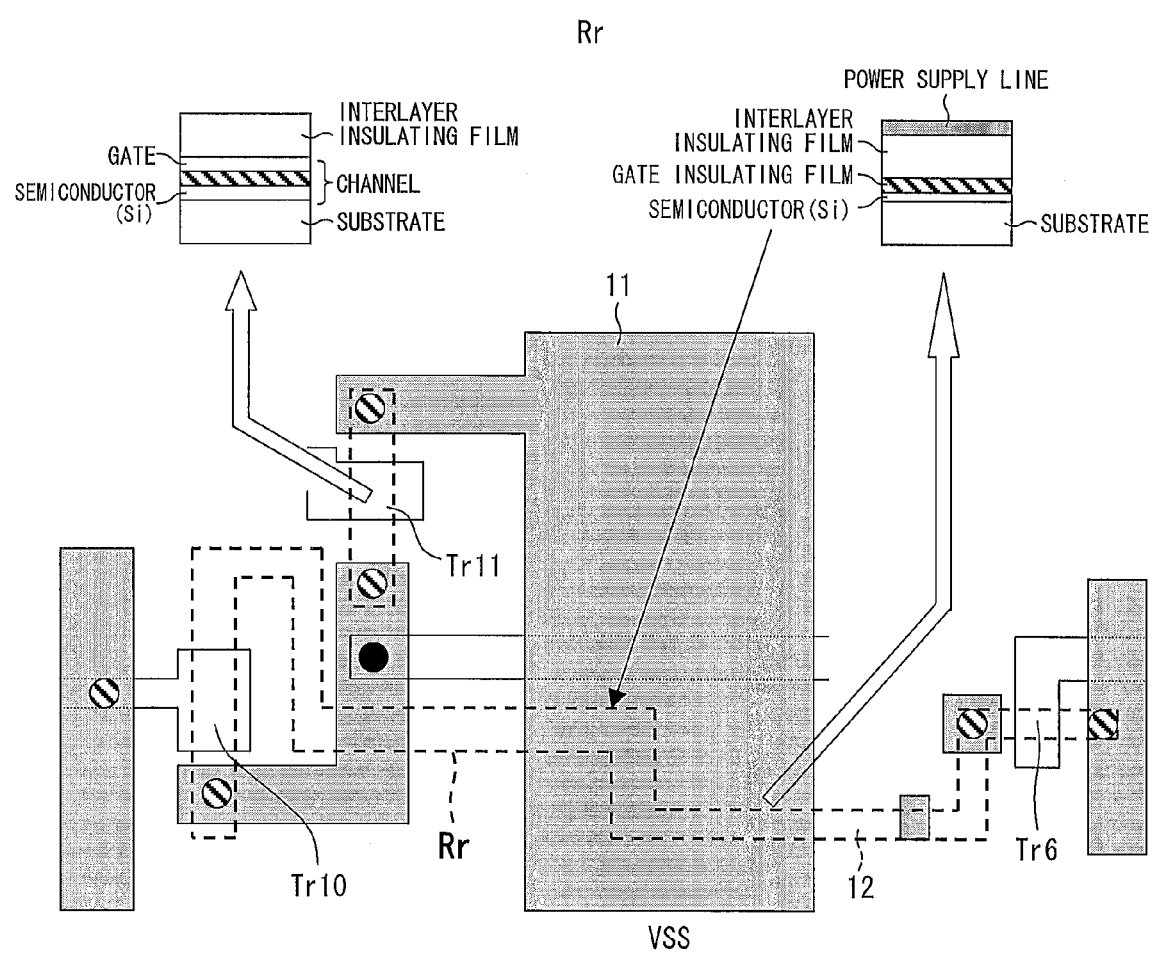
FIG. 1 is a plan view illustrating an example of a layout pattern of an area surrounding a region where a resistor Rr is formed, in a flip-flop illustrated in FIG. 3.
Figure 2:
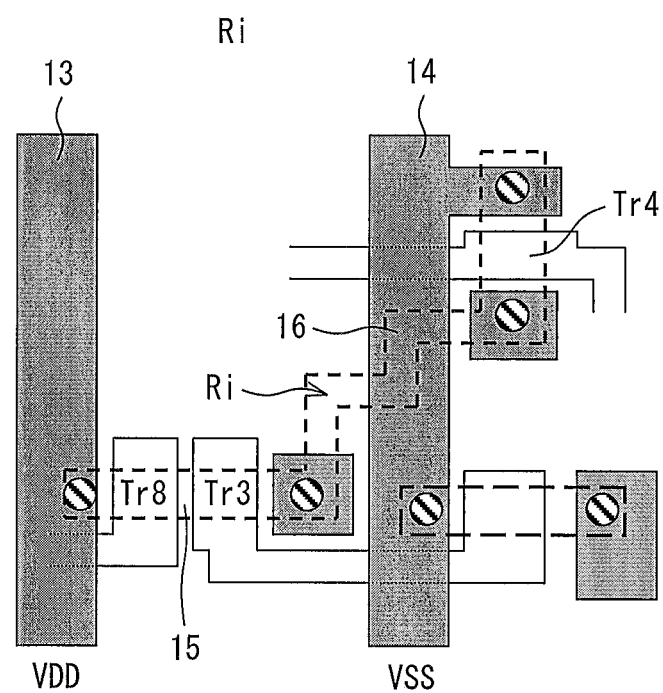
FIG. 2 is a plan view illustrating an example of a layout pattern of an area surrounding a region where a resistor Ri is formed, in the flip-flop illustrated in FIG. 3.

FIG. 1 illustrates a layout pattern of the area surrounding the region where the resistor Rr is formed. FIG. 2 illustrates a layout pattern of the area surrounding the region where the resistor Ri is formed. In FIGS. 1 and 2, a region marked with a dashed line indicates the silicon layer, a region marked with a solid line indicates the gate layer, and a region filled with a color of gray indicates the metal layer. Note that in FIGS. 1 and 2, the gate insulating film and the interlayer insulating film are transparent.

As illustrated in FIG. 1, in a planar view, in the area surrounding the region where the resistor Rr is formed, a power supply line 11 through which the first power VSS is supplied is formed so as to extend in a single direction, and transistors Tr10 and Tr11 are formed in one of zones between which the power supply line 11 lies, and the transistor Tr6 is formed in the other zone.

As illustrated in FIG. 2, in a planar view, in the area surrounding the region where the resistor Ri is formed, a power supply line 13 through which the second power VDD is supplied and a power supply line 14 through which the first power VSS is supplied are formed so as to extend in one and the same direction, the transistors Tr8 and Tr3 are formed in a zone between the power supply line 13 and the power supply line 14, and the transistor Tr4 is formed in a zone which is on the opposite side of the power supply line 14 with respect to the power supply line 13.

The transistors are formed in identical configurations although the transistors are laid out at respectively different positions. Each of the transistors is formed of a silicon layer, a gate insulating film, a gate electrode, an interlayer insulating film, a drain electrode, and a source electrode. As an example, FIG. 1 illustrates a cross-section structure of a gate electrode of the transistor Tr11.

The silicon layer is formed on the substrate. In the silicon layer, each region (each diffusion layer) is formed of amorphous silicon, polysilicon, or the like so as to constitute an n-channel transistor. The gate insulating film is formed on the substrate so as to cover the silicon layer. The gate insulating film is composed of, for example, silicon nitride, or the like.

The gate electrode is formed on the gate insulating film. The gate electrode is placed so as to overlap the silicon layer (specifically, a channel formation layer of the silicon layer) in a planar view. The gate electrode may be composed of a metallic film made of, for example, titanium, chromium, aluminum, molybdenum, tantalum, tungsten, copper, or the like metal, or may be composed of an alloy film made of these metals or a laminated film made from the metallic film and the alloy film. The interlayer insulating film is formed on the gate insulating film so as to cover the gate electrode. The interlayer insulating film is composed of, for example, silicon nitride, or the like.

The drain electrode and the source electrode are formed on the interlayer insulating film. The drain electrode is placed so as to overlap the silicon layer (specifically, a drain region of the silicon layer) in a planar view, and the drain electrode is connected to the silicon layer via a contact hole. The source electrode is placed so as to overlap the silicon layer (specifically, a source region of the silicon layer) in a planar view, and the source electrode is connected to the silicon layer via a contact hole. The drain electrode and the source electrode are placed to sandwich the gate electrode therebetween in a planar view.

As illustrated in FIG. 1, a source electrode of the transistor Tr6 and a drain electrode of the transistor Tr10 are connected to each other via a silicon line 12. The silicon line 12 is formed in the same layer as the silicon layers of the transistors Tr6 and Tr10, and the silicon line 12 is made of the material of which the silicon layer is made.

The resistor Rr is formed from the silicon line 12. The silicon line 12, which has a resistance, can therefore be functioned as a resistor. The silicon line 12 overlaps the power supply line 11 in a planar view (positioned in a layer that is placed under the power supply line 11) and is bent at the overlapping portion. FIG. 1 illustrates a cross-section structure of the overlapping portion where the silicon line 12 and the power supply line 11 overlap each other. In FIG. 1, the silicon line 12, the gate insulating film, the interlayer insulating film, and the power supply line 11 are formed on the substrate in this order from the substrate side.

As illustrated in FIG. 2, a source electrode of the transistor Tr8 and a drain electrode of the transistor Tr3 are connected to each other via a silicon line 15. The silicon line 15 is formed in the same layer as the silicon layers of the transistors Tr8 and Tr3, and the silicon line 15 is made of the material of which the silicon layer is made.

A source electrode of the transistor Tr3 and a drain electrode of the transistor Tr4 are connected to each other via a silicon line 16. The silicon line 16 is formed in the same layer as the silicon layers of the transistors Tr3 and Tr4, and the silicon line 16 is made of the material of which the silicon layer is made.

The resistor Ri is formed from the silicon line 16. The silicon line 16, which has a resistance, can therefore be functioned as a resistor. The silicon line 16 overlaps the power supply line 14 in a planar view and is bent at the overlapping portion.

According to the above-described configuration, connections between the transistors are made by using the silicon lines 12, 15, and 16. This makes it possible to reduce the number of contact holes and to reduce a layout area required for the connections between the transistors. Further, the silicon lines 12 and 16 function as resistors. This makes it possible to eliminate an increase in number of contact holes and an increase in layout area.

As described above, all of the transistors contained in the flip-flop FF are of an identical conductivity type. This makes possible to realize connections between the transistors by using silicon lines that are made of the material of which the silicon layers of the respective transistors are made. That is, connection between the transistors is realized by coupling a silicon layer of one transistor with a silicon layer of the other transistor. This, in turn, enables reduction of the number of contact holes and reduction of a layout area required for connections between the transistors.

In addition, formation of the resistors can be realized by using the silicon lines, and respective resistance values of the resistors can be set by adjusting lengths of the silicon lines. Further, the silicon lines 12 and 16 functioning as resistors are bent at overlapping portions where the silicon lines 12 and 16 overlap the power supply lines 11 and 14, respectively. This makes it possible to reduce, for example, noise from a liquid crystal layer. However, the silicon lines 12 and 16 are not necessarily bent depending on a magnitude of noise impact.

Note that the layout patterns illustrated in FIGS. 1 and 2, which are merely examples, are not intended to limit the present invention, except for the characteristic configuration that the silicone lines are used for a connecting portion that connects the transistors. That is, sizes and placements of the power supply lines and the transistors may be set appropriately based on a design. In addition, layouts of regions other than the regions illustrated in FIGS. 1 and 2 can be arranged appropriately.

Embodiment 2

Figure 8:
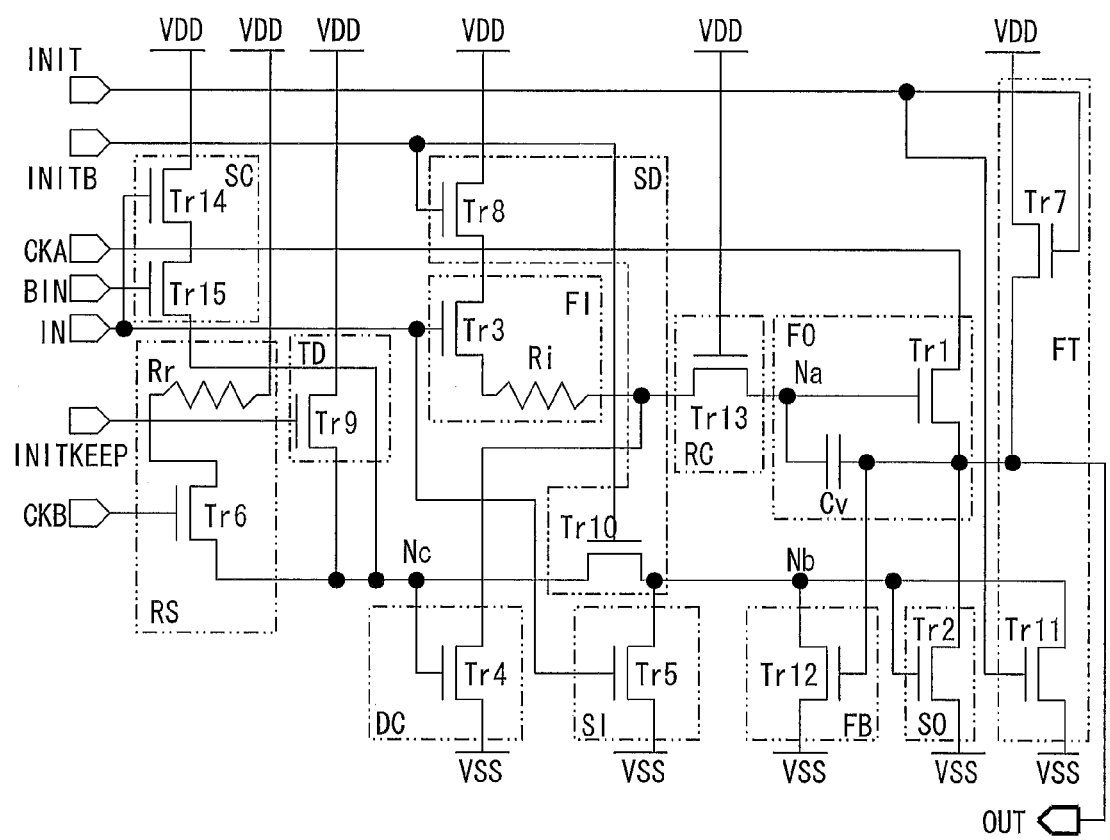
FIG. 8 illustrates a second embodiment of a flip-flop according to the present invention.

The flip-flop illustrated in FIG. 3 can be modified as illustrated in FIG. 8. FIG. 8 illustrates an example configuration of the flip-flop FF according to the present embodiment. As compared to the flip-flop illustrated in FIG. 3, the flip-flop FF illustrated in FIG. 8 is different in that the resistor Rr is located in a different position, but the flip-flop FF illustrated in FIG. 8 is identical in other arrangements. That is, the resistor Rr is provided between the drain electrode of Tr6 and the VDD.

Figure 9:
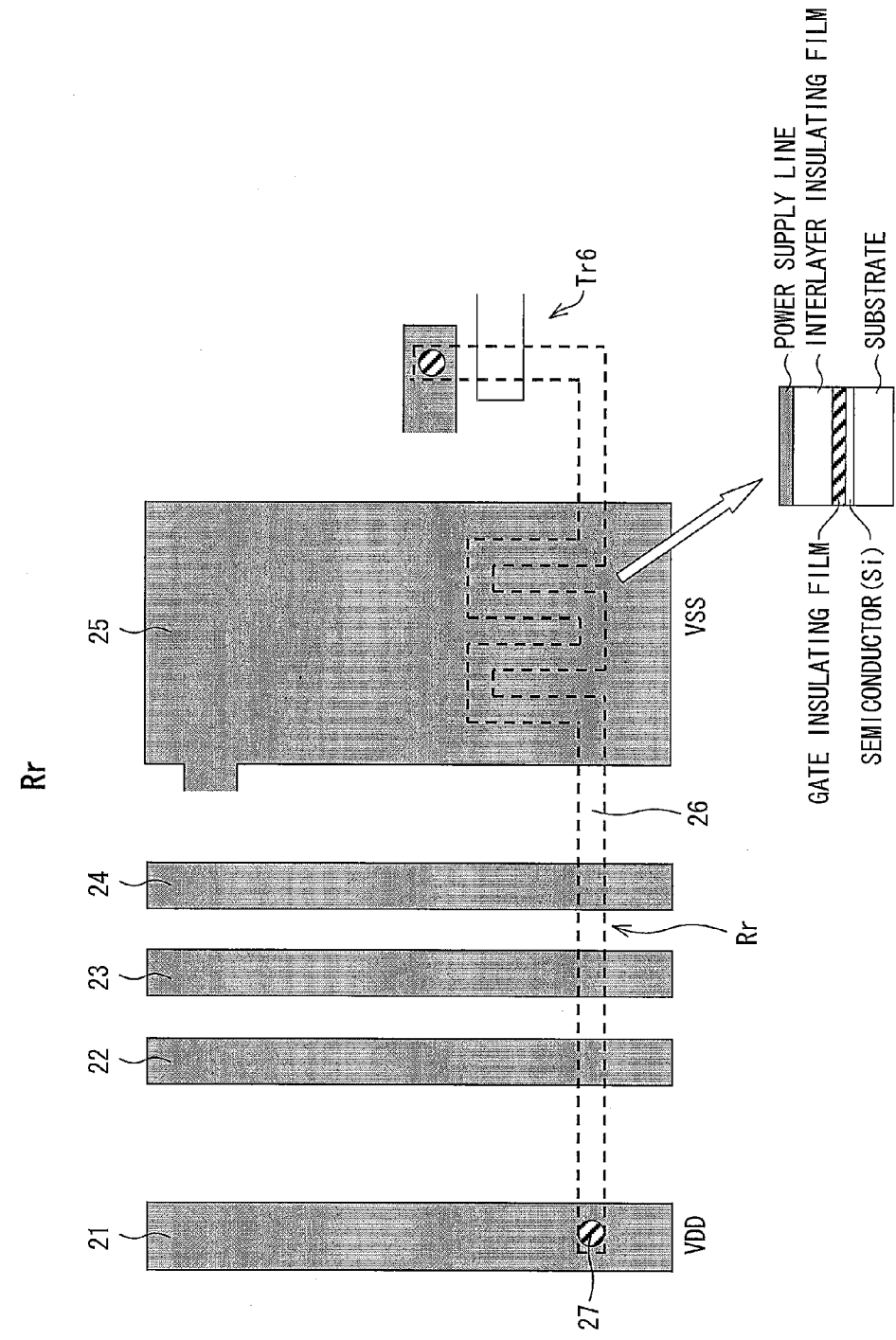
FIG. 9 is a plan view illustrating an example of a layout pattern of an area surrounding a region where a resistor Rr is formed, in the flip-flop illustrated in FIG. 8.

FIG. 9 illustrates a layout pattern of an area surrounding a region where the resistor Rr is formed, according to the present embodiment. In FIG. 9, a region marked with a dashed line indicates the silicon layer, a region marked with a solid line indicates the gate layer, a region filled with a color of gray indicates the metal layer, and the gate insulating film and the interlayer insulating film are transparent.

As illustrated in FIG. 9, in a planar view, in the area surrounding the region where the resistor Rr is formed, a power supply line 21, signal lines 22 through 24, and a power supply line 25 are formed so as to extend in a single direction, and the transistor Tr6 is formed in a zone which is on the opposite side of the power supply line 25 with respect to the signal line 24. The power supply line 21 is supplied with the second power VDD, while the power supply line 25 is supplied with the first power VSS. The signal lines 22 through 24 receive various signals (for example, the INIT signal, etc.).

The drain electrode of the transistor Tr6 and the power supply line 21 are connected to each other through a silicon line 26 and a contact hole 27. The silicon line 26 is formed in the same layer as the silicon layer of the transistor Tr6, and the silicon line 26 is made of the material of which the silicon layer is made. The silicon line 26 is connected to the power supply line 21 via the contact hole 27.

The resistor Rr is formed from the silicon line 26. The silicon line 26, which has a resistance, can therefore be functioned as a resistor. The silicon line 26 overlaps the power supply line 21, the signal lines 22 through 24, and the power supply line 25 in a planar view (positioned in a layer that is placed under the power supply line 21, the signal lines 22 through 24, and the power supply line 25) and is bent at the overlapping section where the silicon line 26 overlaps the power supply line 25 having a particularly large width. FIG. 9 illustrates a cross-section structure of the overlapping section where the silicon line 26 and the power supply line 25 overlap each other. In FIG. 9, the silicon line 26, the gate insulating film, the interlayer insulating film, and the power supply line 25 are formed on the substrate in this order from the substrate side.

According to the above-described configuration, connections between the transistor and the power supply lines are made by using the silicon line 26. This makes it possible to reduce the number of contact holes and to reduce a layout area required for the connections between the transistor and the signal lines. Further, the silicon line 26 functions as a resistor. This makes it possible to eliminate an increase in number of contact holes and an increase in layout area.

Note that the layout pattern illustrated in FIG. 9, which is merely an example, is not intended to limit the present invention, except for the characteristic configuration that the silicone line is used for a connecting portion that connects the transistor and the power supply line. That is, sizes and placements of the power supply lines, the signal lines, and the transistor may be set appropriately based on a design. In addition, layouts of regions other than the regions illustrated in FIG. 9 can be arranged appropriately.

Thus, the above descriptions have discussed that the flip-flop arranged such that the silicon line is used for the "connecting portion that connects the transistors" and for the "connecting portion that connects the transistor and the power supply line" achieves the effect of reducing a layout area.

However, the present invention is not limited to the flip-flops illustrated in FIGS. 3 and 8 and may be other transistor circuit, i.e. a transistor circuit arranged such that the transistor circuit includes at least one of "a connecting portion that connects the transistors" and "a connecting portion that connects the transistor and the signal line", and all of a plurality of transistors included in the transistor circuit are of an identical conductivity type. Use of the silicon lines for these connecting portions enables achievement of the above-described effect.

Note that the transistor circuit, depending on its circuit configuration, may have a larger number of components and also require a plurality of signal lines. This has no other choice but to place these components and lines in a complex layout. In this case, connections between these components and lines may be made as appropriate through a contact hole(s) and a lead(s) (which are formed in either the gate layer or the metal layer). Even with such an arrangement, the configuration of the present embodiment allows partially using silicon lines, thus achieving the effect of reducing a layout area.

The following will describe, as examples of a transistor circuit applicable to the present invention, an inversion signal generation circuit (Embodiment 3), an inverter circuit (Embodiment 4), and a signal processing circuit (Embodiment 5). Note that in layout patterns described in the following embodiments, unless otherwise specified, an arrangement of the layers on the substrate is identical to the foregoing arrangement (from the substrate side, the layers are provided in the order of: a silicon layer; a gate layer; and a metal layer, and a gate insulating film is formed between the silicon layer and the gate layer, while an interlayer insulating film is formed between the gate layer and the metal layer). Further, in the drawings illustrating the layout patterns, unless otherwise specified, a region marked with a dashed line indicates the silicon layer, a region marked with a solid line indicates the gate layer, a region filled with a color of gray indicates the metal layer, and the gate insulating film and the interlayer insulating film are transparent.

Embodiment 3

Figure 10:
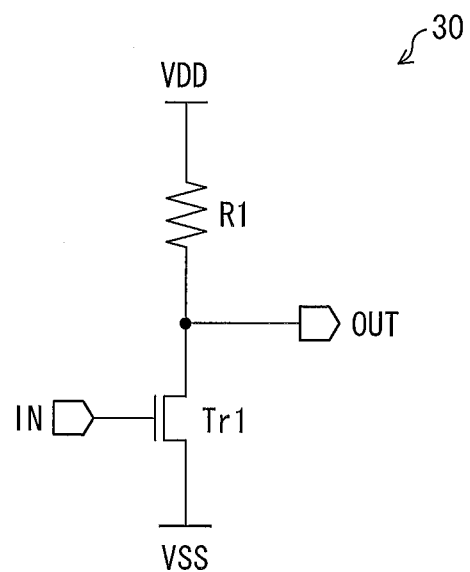
FIG. 10 illustrates an embodiment of the present invention and is a circuit diagram illustrating an embodiment of an inversion signal generation circuit.

FIG. 10 illustrates an example configuration of an inversion signal generation circuit 30 according to the present embodiment. The inversion signal generation circuit 30 is configured such that a resistor R1 and a transistor Tr1 are connected in series to each other between the VDD and VSS (Note that the resistor R1 is located on the side of the VDD, while the transistor Tr1 is located on the side of VSS.), a gate electrode (control terminal) of the transistor Tr1 is connected to an IN terminal, and a drain electrode (conduction terminal) is connected to an OUT terminal. The inversion signal generation circuit 30 is a circuit that generates an OUT signal which is inverted from an IN signal. For example, the inversion signal generation circuit 30 is used as a circuit for switching a scanning direction of a shift register which inverts generates an inversion signal (UDB) of a scanning direction switching signal (UD) on a basis of the scanning direction switching signal.

Figure 11:
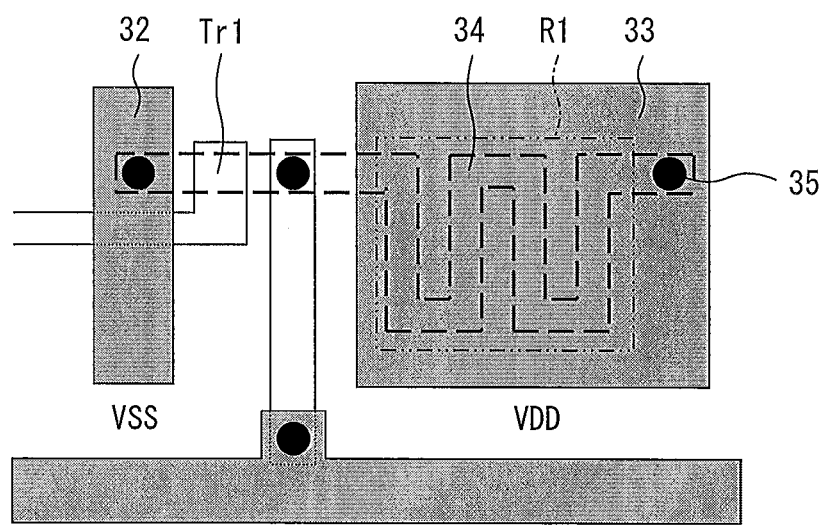
FIG. 11 is a plan view illustrating an example of a layout pattern of the inversion signal generation circuit.

FIG. 11 illustrates an example of a layout pattern of the inversion signal generation circuit 30. As illustrated in FIG. 11, in a planar view, the inversion signal generation circuit 30 is configured such that a power supply line 32, through which VSS is supplied, and a power supply line 33, through which VDD is supplied, are placed on a substrate, and a transistor Tr1 is formed in a region that lies between the power supply line 32 and the power supply line 33.

The drain electrode of the transistor Tr1 and the power supply line 33 are connected to each other through a silicon line 34 and a contact hole 35. The silicon line 34 is formed in the same layer as the silicon layer of the transistor Tr1, and the silicon line 34 is made of the material of which the silicon layer is made. The silicon line 34 is connected to the power supply line 33 via the contact hole 35.

The resistor R1 is formed from the silicon line 34. The silicon line 34 is arranged such that a contact hole 35 is placed at a position that is relatively far from the transistor Tr1, and the silicon line 34 has a long length. The silicon line 34 overlaps the power supply line 33 in a planar view (positioned in a layer that is placed under the power supply line 33) and is bent at the overlapping portion.

According to the above-described configuration, connection between the transistor Tr1 and the power supply line 33 is made by using the silicon line 34, so that the function of a resistor is added. This makes it possible to reduce the number of contact holes and to reduce a layout area required for connection between the transistor Tr1 and the power supply line 33. Further, the silicon line 34 is bent at overlapping portions where the silicon line 34 overlaps the power supply line 33. This makes it possible to reduce, for example, noise from a liquid crystal layer.

Embodiment 4

Figure 12:
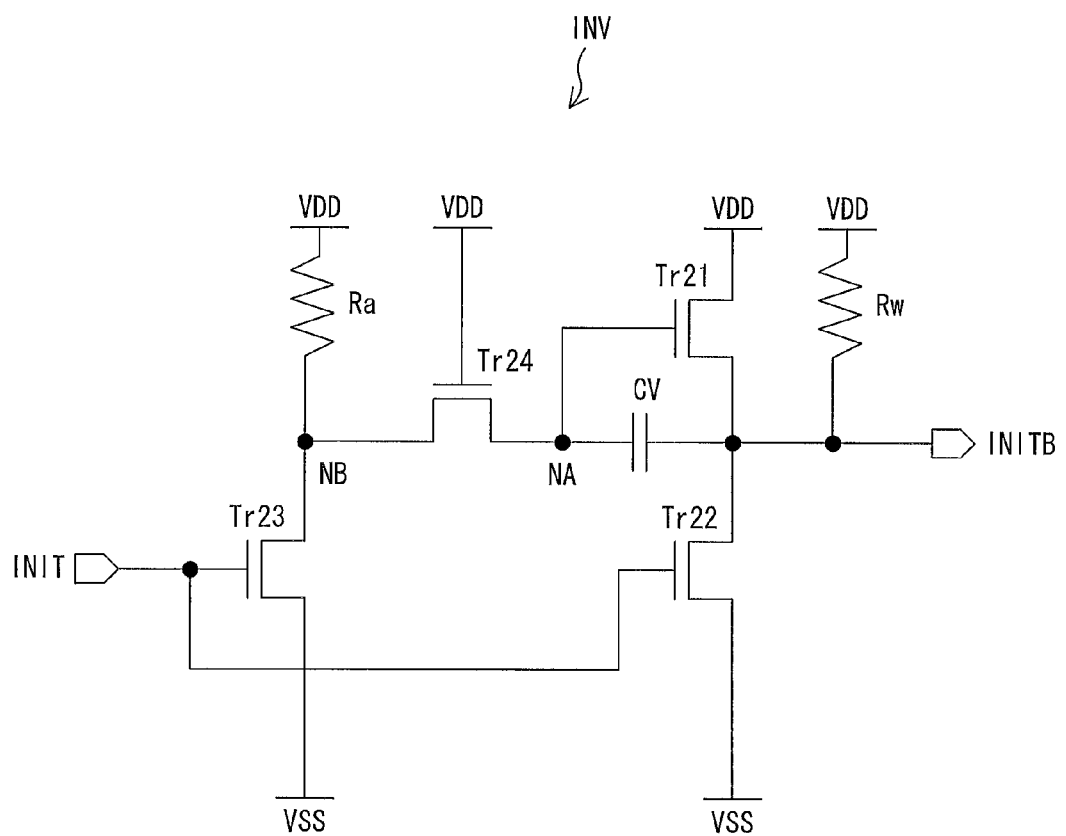
FIG. 12 illustrates an embodiment of the present invention and is a circuit diagram illustrating an embodiment of an inverter circuit.

FIG. 12 illustrates one example configuration of the inverter circuit INV according to Embodiment 4. As illustrated in FIG. 12, the inverter circuit INV includes n-channel transistors Tr21 to Tr24, resistors Ra and Rw, a bootstrap capacitor CV, an IN terminal, and an OUT terminal. For example, an INIT signal is supplied to the IN terminal, and an INITB signal is outputted from the OUT terminal.

The transistor Tr21 is arranged such that: a gate electrode and a source electrode of the transistor Tr21 are connected to each other via the bootstrap capacitor CV; a drain electrode of the transistor Tr21 is connected to the second power source VDD; and the source electrode of the transistor Tr21 is connected to the OUT terminal. Respective gate electrodes of the transistors Tr22 and Tr23 are connected to the IN terminal. A gate electrode of the transistor Tr24 is connected to the second power source VDD. The gate electrode of the transistor Tr21 is connected to a node NA. This node NA is connected to a node NB via the transistor Tr24. The node NB is connected to the second power source VDD via the resistor Ra and is also connected to the first power source VSS via the transistor Tr23. In addition, the OUT terminal is connected to the second power source VDD via the resistor Rw and is also connected to the first power source VSS via the transistor Tr22.

In the inverter circuit INV illustrated in FIG. 12, when the IN terminal becomes active (High), the nodes NA and NB become the VSS potential (Low). Then, the transistor Tr21 is switched OFF while the transistor Tr22 is switched ON. As a result, the VSS potential (Low) is outputted to the OUT terminal. When the IN terminal shifts to inactive (Low) from the above state, the bootstrap capacitor CV is charged through the resistor Ra by the VDD, which causes a current to flow through the transistor Tr21. This in turn boosts a potential of the node NA through the bootstrap capacitor CV, and causes the OUT terminal to output a VDD potential (High) that is free from a potential drop (threshold drop). Note that in the inverter circuit INV illustrated in FIG. 12, since the OUT terminal is connected to the second power source VDD via the resistor Rw, it is possible to keep outputting the VDD potential (power source potential that is free from a potential drop) even after a bootstrap effect wears off. Further, in the configuration of FIG. 12, the transistor Tr24 is provided, and the transistor Tr24 is switched OFF when a potential of the node NA reaches a level equal to or higher than a given level due to the bootstrap effect. This makes it possible to protect the transistor Tr23 from a high voltage.

Figure 13:
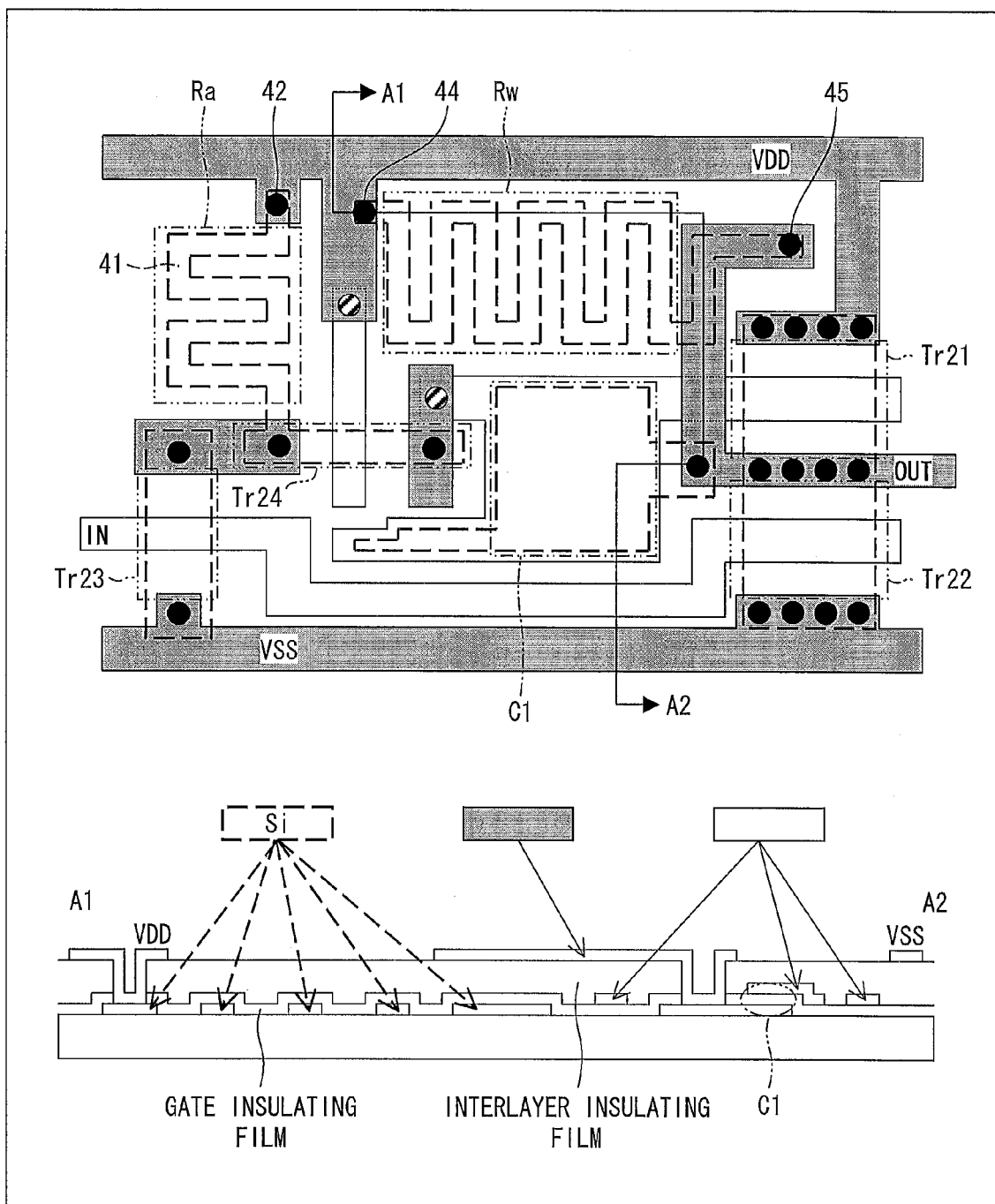
FIG. 13 is a plan view of an example of a layout pattern of the inverter circuit.

FIG. 13 illustrates an example of a layout pattern of the inverter circuit INV. As illustrated in FIG. 13, the power supply lines, the signal lines, the transistors, and the capacitor are formed on the substrate. Note that the layout pattern illustrated in FIG. 13 is merely an example and is not intended to limit the present invention.

In the inverter circuit INV, a drain electrode of the transistor Tr24 and the power supply line VDDL are connected to each other through a silicon line 41 and a contact hole 42. The silicon line 41 is formed in the same layer as a silicon layer of the transistor Tr24 and is made of a material of which the silicon layer is made. The silicon line 41 is connected to the power supply line VDDL via the contact hole 42. The resistor Ra is formed from the silicon line 41.

The power supply line VDDL and the output signal line OUT are connected to each other through a silicon line 44 and contact holes 45 and 46. The silicon line 44 is formed in the same layer as a silicon layer of the transistor Tr24 and is made of a material of which the silicon layer is made. The silicon line 41 is connected to the power supply line VDDL via the contact hole 44 and is connected to an output signal line OUT via the contact hole 45. The resistor Rw is formed from the silicon line 43.

According to the above-described configuration, connection between the transistor Tr24 and the power supply line VDDL is made by using the silicon line 41, so that the function of a resistor is added, and connection between the power supply line VDDL and the output signal line OUT is made by using the silicon line 43, so that the function of a resistor is added. This makes it possible to reduce the number of contact holes and to reduce a layout area required for the connection between the transistor Tr24 and the power supply line VDDL and the connection between the power supply line VDDL and the output signal line OUT. Further, since the silicon lines 41 and 43 are bent in a planar view and have long lengths, it is possible to ensure great resistances even when short straight-line distances are provided between the transistor Tr24 and the power supply line VDDL and between the power supply line VDDL and the output signal line OUT.

Embodiment 5

Figure 14:
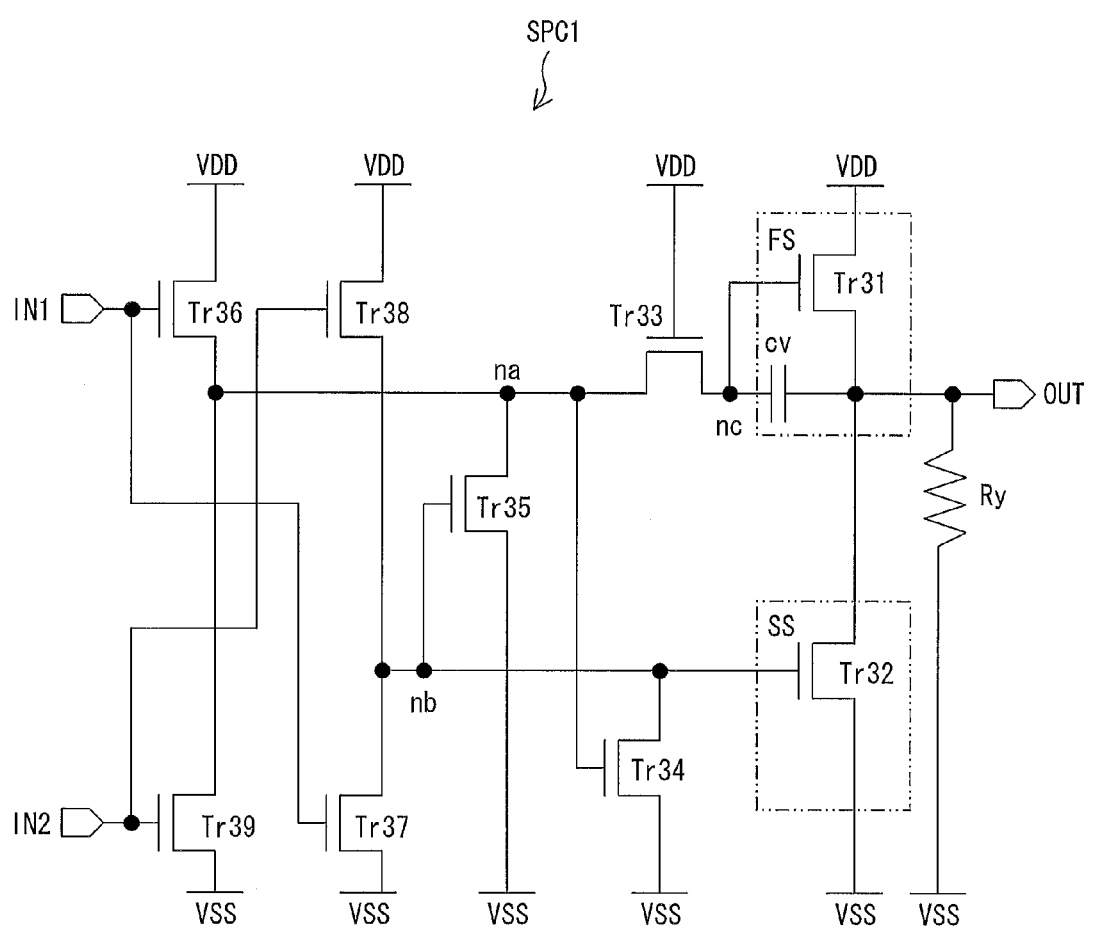
FIG. 14 illustrates an embodiment of the present invention and is a circuit diagram illustrating an embodiment of a signal processing circuit.
Figure 15:
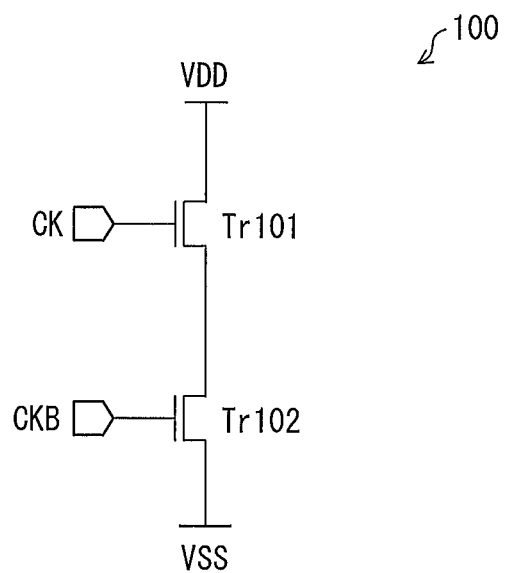
FIG. 15 is a circuit diagram illustrating a configuration of the conventional transistor circuit.
Figure 16A:
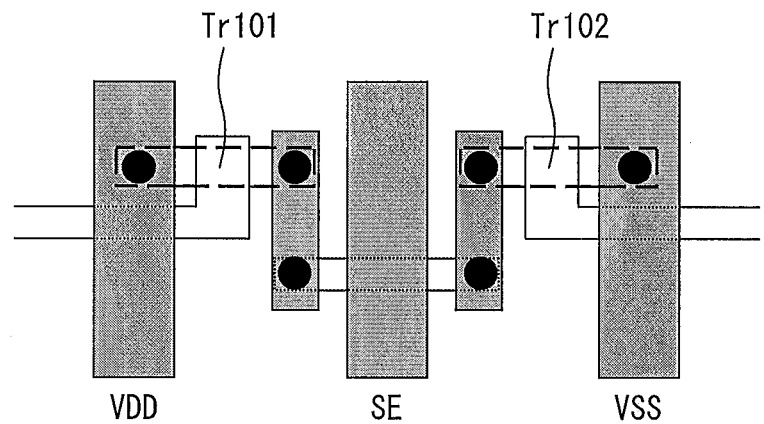
FIG. 16(a) is a plan view illustrating a layout pattern of the conventional transistor illustrated in FIG. 15.
Figure 16B:
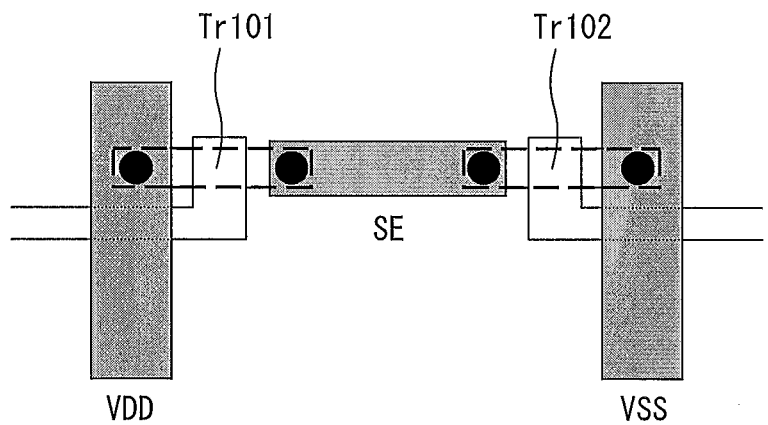
FIG. 16(b) is a plan view illustrating a layout pattern of the conventional transistor illustrated in FIG. 15.

FIG. 14 illustrates an example configuration of a signal processing circuit SPC1 according to Embodiment 5. The signal processing circuit SPC1 illustrated in FIG. 14 includes: an IN1 terminal (first input terminal) and an IN2 terminal (second input terminal); an OUT terminal (output terminal); a node na (first node) and a node nb (second node); a first signal generating section FS that is connected to VDD (first power source) and the OUT terminal and that includes a bootstrap capacitor cv; and a second signal generating section SS that is connected to the node nb, VSS (second power source), and the OUT terminal. When the IN1 terminal becomes active, the node na becomes active (High). When the IN2 becomes active, the node nb becomes active (High). The OUT terminal is connected to the VSS via a resistor Ry.

Specifically, the signal processing circuit SPC1 includes (i) a transistor Tr31 provided in the first signal generating section FS, (ii) a transistor Tr32 provided in the second signal generating section SS, and (iii) transistors Tr33 through Tr39. The transistor Tr31 is configured such that: a drain electrode of the transistor Tr31 is connected to VDD; a source electrode and a gate electrode of the transistor Tr31 are connected to each other via the bootstrap capacitor cv; and the source electrode of the transistor Tr31 is connected to the OUT terminal, is also connected to VSS via the resistor Ry, and is further connected to VSS via the transistor Tr32. The transistors Tr32 and Tr35 each have a gate electrode connected to the node nb. The transistor Tr34 has a gate electrode connected to the node na. The transistors Tr36 and Tr37 each have a gate electrode connected to the IN1 terminal. The transistors Tr38 and Tr39 each have a gate electrode connected to the IN2 terminal. The gate electrode of the transistor Tr31 is connected to the node nc, which is then connected to the node na via the transistor Tr33. The node na and the VSS are connected to each other via the transistor Tr35. The node nb and the VSS are connected to each other via the transistor Tr34. The node na and the VDD are connected to each other via the transistor Tr36. The node na and the VSS are further connected to each other via the transistor Tr39. The node nb and the VDD are connected to each other via the transistor Tr38. The node nb and the VSS are further connected to each other via the transistor Tr37.

The signal processing circuit SPC1 illustrated in FIG. 14 is arranged such that when the IN1 terminal becomes active (High) while the IN2 terminal is inactive (Low), the node na becomes active (High), and the node nb becomes inactive (Low) (that is, the transistors Tr36 and Tr37 are switched ON). This charges the bootstrap capacitor cv, and causes a current to flow through the transistor Tr31. This in turn boosts the electric potential of the node nc through the bootstrap capacitor cv, and causes the OUT terminal to output a VDD potential (High) that is free from a potential drop (threshold drop). Then, when the IN1 terminal becomes inactive (Low) (while the IN2 terminal remains inactive), the nodes nc and nb each start floating. The OUT terminal thus continues to output the VDD potential (High). Next, when the IN2 terminal becomes active (High), the node nb becomes active (High), and the node na becomes inactive (Low) (that is, the transistors Tr38, Tr39, and Tr32 are switched ON). This causes the OUT terminal to output a VSS electric potential (Low).

In the signal processing circuit SPC1, since the OUT terminal is connected to the VSS via the resistor Ry, the OUT terminal does not become floating for a period during which the IN1 and IN2 terminals become inactive. In the case where the resistor Ry is set to have a high resistance value ranging from 0.5 to 5.5 megaohms, the initial value (that is, the source electric potential of the transistor Tr1 for a period until the IN1 terminal becomes active) of the OUT terminal can be set with use of the resistor Ry. With this arrangement, the bootstrap circuit of the first signal generating section FS functions normally when the IN1 terminal becomes active (High).

Further, since the signal processing circuit SPC1 illustrated in FIG. 14 has the transistors Tr34 and Tr35 provided therein. This ensures that the node nb can be at VSS (inactive) during a period in which the node na is active, and that the node na can be at VSS (inactive) during a period in which the node nb is active. With this arrangement, it is possible to reliably maintain an output in a previous state during the periods in which the IN1 and IN2 terminals become inactive.

Still further, the signal processing circuit SPC1 illustrated in FIG. 14 is preferably arranged such that the IN1 and IN2 terminals are inactive at an initial operation of the signal processing circuit SPC1. With this arrangement, it is possible to further ensure functioning of the bootstrap circuit of the first signal generating section FS.

Note that the signal processing circuit SPC1 illustrated in FIG. 14 is provided with the transistor Tr33. Therefore, when a potential of the node nc reaches a level equal to or higher than a given level due to the bootstrap effect, the transistor Tr33 is switched OFF. This makes it possible to protect the transistors (Tr34, Tr35, Tr36, and Tr39) connected to the node na from a high voltage.

The layout pattern of the above signal processing circuit SPC1 may be set appropriately based on a design. Although not illustrated, the resistor Ry can be formed from a silicon line resistor through which the power supply line VSS and the OUT terminal are connected to each other.

The present invention is not limited to the above embodiments, but further encompasses (i) embodiments achieved by appropriately modifying the above embodiment on the basis of known techniques and common general technical knowledge and (ii) embodiments achieved by combining such embodiments. Further, the operational advantages and the like described in the above embodiment are merely examples.

A transistor circuit according to the present invention has a configuration such that the transistor circuit includes: at least one transistor, wherein at least part of a connecting portion that connects the transistor and a signal line is formed from a material of which a channel of the transistor is made.

Further, the transistor circuit according to the present invention has a configuration such that the transistor circuit includes: a plurality of transistors; and at least one of a connecting portion that connects the transistors and a connecting portion that connects the transistor and a signal line, wherein all of the plurality of transistors included in the transistor circuit are of an identical conductivity type, and the connecting portion is formed from a material of which channels of the respective transistors are made.

The transistor circuit is preferably such that from a substrate side, layers are provided in the following order of: a channel layer where the channel of the transistor is formed; a gate layer where a gate electrode of the transistor is formed; and a metal layer where the signal line is formed.

The transistor circuit is preferably such that the connecting portion overlaps the signal line.

The transistor circuit is preferably such that the connecting portion function as a resistor.

The transistor circuit is preferably such that the connecting portion is bent at an overlapping portion where the connecting portion overlaps the signal line.

The transistor circuit is preferably such that the signal line is a power supply line.

The transistor circuit is preferably such that the at least one transistor is one of transistors, the transistor circuit further includes a resistor, and the transistor has (i) a control terminal connected to an input terminal, (ii) one conduction terminal connected to an output terminal and connected to a first power source via the resistor, and (iii) another conduction terminal connected to a second power source.

A flip-flop according to the present invention has a configuration such that the flip-flop includes: an input terminal; an output terminal; first and second clock signal terminals; a first output section including a bootstrap capacitor and being connected to the first clock signal terminal and the output terminal; a second output section being connected to a first power source and the output terminal; a first input section being connected to the input terminal and a second power source and charging the bootstrap capacitor; a discharge section discharging the bootstrap capacitor; a second input section being connected to the input terminal and the first power source and being connected to the second output section; and a reset section being connected to the second clock signal terminal and controlling the discharge section and the second output section, the foregoing sections including transistors all of which are of an identical conductivity type, and the flip-flop further includes: at least one of a connecting portion that connects the transistor included in the reset section and the second power source and a connecting portion that connects the transistor included in the reset section and the transistor included in the other section, the connecting portion being formed of a material of which channels of the respective transistors are made.

The flip-flop is preferably such that the flip-flop further includes: a connecting portion that connects the transistor included in the first input section and the transistor included in the other section, the connecting portion being formed of a material of which channels of the respective transistors are made.

A signal processing circuit according to the present invention has a configuration such that the signal processing circuit includes: first and second input terminals; an output terminal; a first output section including a bootstrap capacitor and being connected to the second input terminal and the output terminal; a second output section being connected to the first input terminal, a first power source, and the output terminal; a charge section charging the bootstrap capacitor; and a discharge section being connected to the first input terminal and discharging the bootstrap capacitor, the foregoing sections including transistors all of which are of an identical conductivity type, and the signal processing circuit further includes: a connecting portion that connects the transistor included in the first output section and the second power source, the connecting portion being formed of a material of which channels of the respective transistors are made.

The signal processing circuit is preferably such that the signal processing circuit further includes: a connecting portion that connects the transistor included in the charge section and the second power source, the connecting portion being formed of a material of which channels of the respective transistors are made.

INDUSTRIAL APPLICABILITY

The flip-flop of the present invention is suitably used particularly in a driver circuit for a liquid crystal display device.

REFERENCE SIGNS LIST 12, 15, 16, 26, 34, 41, and 43 Silicon lines (connecting portions)

The invention claimed is:
1. A transistor circuit comprising:
at least one transistor, wherein
at least a portion of a connecting portion that is arranged to connect the transistor and a signal line is made from a same material of which a channel of the transistor is made;
the connecting portion overlaps the signal line; and
the connecting portion is bent at an overlapping portion positioned where the connecting portion overlaps the signal line.
2. The transistor circuit according to claim 1, wherein the transistor circuit is a flip flop, the flip-flop comprising:
an input terminal;
an output terminal;
first and second clock signal terminals;
a first output section including a bootstrap capacitor and being connected to the first clock signal terminal and the output terminal;
a second output section being connected to a first power source and the output terminal;
a first input section being connected to the input terminal and a second power source and charging the bootstrap capacitor;
a discharge section discharging the bootstrap capacitor;
a second input section being connected to the input terminal and the first power source and being connected to the second output section; and
a reset section being connected to the second clock signal terminal and controlling the discharge section and the second output section,
the foregoing sections including transistors all of which are of an identical conductivity type,
the flip-flop further comprising:
at least one of a connecting portion that connects the transistor included in the reset section and the second power source and a connecting portion that connects the transistor included in the reset section and the transistor included in the other section,
the connecting portion being formed of a material of which channels of the respective transistors are made.

3. The flip-flop according to claim 2, further comprising:
a connecting portion that connects the transistor included in the first input section and the transistor included in the other section, the connecting portion being formed of a material of which channels of the respective transistors are made.

4. The transistor circuit according to claim 1,
wherein the transistor circuit is a signal processing circuit, the signal processing circuit comprising:
first and second input terminals;
an output terminal;
a first output section including a bootstrap capacitor and being connected to the second input terminal and the output terminal;
a second output section being connected to the first input terminal, a first power source, and the output terminal;
a charge section charging the bootstrap capacitor; and
a discharge section being connected to the first input terminal and discharging the bootstrap capacitor,
the foregoing sections including transistors all of which are of an identical conductivity type,
the signal processing circuit further comprising:
a connecting portion that connects the transistor included in the first output section and the second power source, the connecting portion being formed of a material of which channels of the respective transistors are made.

5. The signal processing circuit according to claim 4, further comprising:
a connecting portion that connects the transistor included in the charge section and the second power source, the connecting portion being formed of a material of which channels of the respective transistors are made.

6. A signal processing circuit comprising:
first through third input terminals;
first and second nodes;
a first signal generating section being connected to the first node, the third input terminal, and an output terminal and including a bootstrap capacitor; and
a second signal generating section being connected to the second node, a first power source, and the output terminal,
the first node becoming active when the first input terminal becomes active,
the second node becoming active when the second input terminal becomes active,
the signal processing circuit further comprising:
a connecting portion that connects a transistor included in the first signal generating section and the first power source, the connecting portion being formed of a material of which channels of respective transistors are made.

* * * * *